May 28, 1963 J. M. LAVINE 3,091,706

SEMICONDUCTOR DEVICES WITH IMPROVED CARRIER INJECTION
TO ALLOW INCREASED FREQUENCY RESPONSE (SPACISTORS)
Filed May 16, 1960

INVENTOR
JEROME M. LAVINE

BY Joseph D. Pannone
ATTORNEY

United States Patent Office 3,091,706

Patented May 28, 1963

3,091,706

SEMICONDUCTOR DEVICES WITH IMPROVED CARRIER INJECTION TO ALLOW INCREASED FREQUENCY RESPONSE (SPACISTORS)

Jerome M. Lavine, Waltham, Mass., assignor to Raytheon Company, Lexington, Mass., a corporation of Delaware Filed May 16, 1960, Ser. No. 29,346
14 Claims. (Cl. 307—88.5)

This invention pertains generally to semiconductor devices employing injection of current carriers into a space-charge region, and more particularly to semiconductor devices of this type having improved injection structure.

A relatively recent advance in this art is the semiconductor device having a P-N junction and a space-charge region associated therewith, with means for injecting current carriers (either in the form of electrons or holes) into the space-charge region in controllable amounts. Such devices have been termed Spacistors, and due to a sharply reduced transit time (as compared to that of transistors) for the travel of carriers therein, Spacistors are admirably suited to relatively high frequency applications. That is to say, the transit time of a current carrier through the base region of a transistor has generally been so long as to seriously limit the frequency response of the device, whereas the Spacistor is not so limited, in view of the fact that in the Spacistor the carriers are injected into a region of high electric field intensity. This region is the space-charge region produced in the vicinity of a rectifying junction upon the application of a reverse bias thereto, and the decrease in transit time is the result of an accelerating force imparted to the current carriers by the strong electric field existent in the space-charge region.

While the advent of the Spacistor has extended upwardly the useful range of frequencies in which semiconductor devices may be employed, the Spacistors or space-charge injection devices of the prior art have been characterized by undesirably small carrier injection capabilities. For example, in some instances it has been necessary to apply a bias of approximately 100 volts in order to obtain a carrier current of the order of 100 microamperes or less.

It is accordingly one of the primary objects of the present invention to provide a semiconductor device of the space-charge injection type having greatly improved current carrier injection capabilities.

A concomitant object of this invention is to provide a semiconductor device of the space-charge injection type with improved current carrier injection structure.

An ancillary object of the invention is to provide a semiconductor device of the space-charge injection type having greatly improved current carrier injection capabilities, along with exemplary circuitry for applying the desired bias potentials thereto.

In accordance with a preferred form of the present invention, the above and other objects are achieved by means of a device comprising a body of semiconductor material, one portion of which is doped with an N-type impurity to form a body portion of N-type conductivity, and a second portion of which is relatively heavily doped with a P-type impurity to form a body portion of P-type conductivity. The junction between these two body portions thus constitutes a rectifying P-N junction, and upon the application of a suitable reverse bias potential across this junction, a space-charge region is produced in the immediate vicinity thereof. By virtue of the fact that the N region is lightly doped, the space charge extends well into the N portion of the semiconductor body, to a degree determined by the level of doping therein. In order to provide a desirably large surface area on the semiconductor body within the space-charge region or layer, a side face of the body (one which is intersected by the space-charge region) may be suitably beveled.

At a surface area entirely within the intersection of the space-charge region and a side face of the N portion of the semiconductor body (such as the aforementioned beveled face) there is applied a contact member of P conductivity type to form a rectifying junction with the contiguous face of the N portion. A contact member of N conductivity type is applied to the outer face of the P-doped contact, forming a rectifying junction therewith. Upon the application of a suitable bias potential across this last-mentioned junction, a large number of electrons will diffuse into the P-doped contact from the N-doped contact. With an appropriate bias applied between the P-doped contact and the P portion of the main body, as well as the aforementioned bias between the N and P portions which establishes the space-charge region, a copious injection of electrons occurs from the P-doped contact into the space-charge region of the main semiconductor body.

In prior space-charge injection semiconductor devices it has been customary to employ a metal point contact, on the one hand, or a P or N doped alloyed or diffused contact, on the other hand, to achieve the desired carrier injection. However, the rate of injection has proved to be limited to a value which proves to be too low for many applications. It may be shown that carrier injection as performed in the past is space-charge limited, in a manner analogous to that which obtains in the vacuum tube art. By means of the present invention, injection is performed in a manner which is not space-charge limited, but which is, to continue the analogy to vacuum tube operation, temperature limited. In short, the effect of the barrier to copious injection which exists in prior Spacistors and the like is negated by the present invention.

With the above considerations and objects in mind, the invention itself will now be described in connection with a preferred embodiment thereof, given by way of example and not of limitation, taken in connection with the appended drawings, in which.

Figures 1, 2:
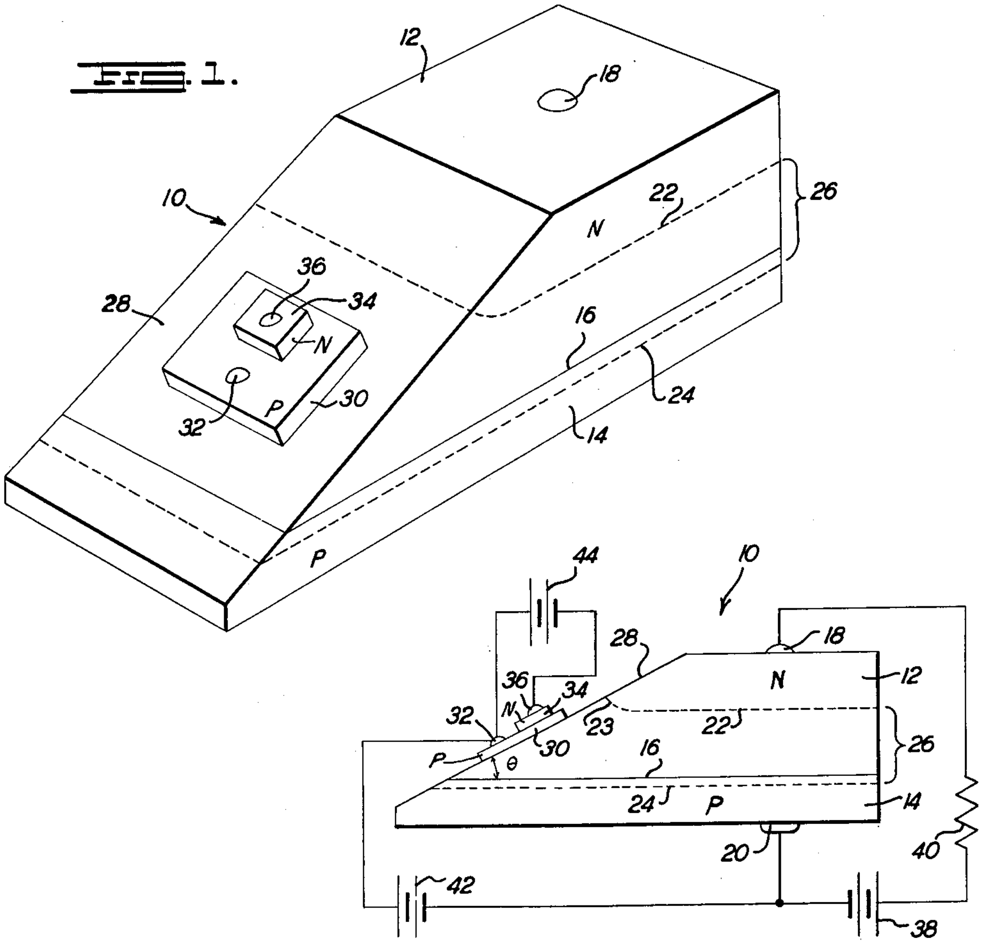
FIG. 1 is a perspective view of a semiconductor device in accordance with the present invention.
FIG. 2 is a side elevation view of the device of FIG. 1, shown in connection with a schematic representation of exemplary circuitry for establishing desired bias potentials thereon.

Referring now to FIG. 1 in particular, a preferred form of the semiconductor device of the present invention is indicated generally at 10, and includes a portion 12 of N-type conductivity, and a portion 14 of P-type conductivity. The P-N rectifying junction between portions 12 and 14 is indicated by the solid line 16. An ohmic contact 18 is provided on one face of N portion 12, and a similar ohmic contact 20 (see FIG. 2) is provided on a face of P portion 14.

Upon the application of a suitable reverse bias potential to contact members 18 and 20, producing a reverse bias across rectifying junction 16, a space-charge region results in the vicinity of the junction 16, the upper and lower limits of this space-charge region being indicated by the dotted lines 22 and 24. As may be seen in FIGS. 1 and 2, the space-charge region, indicated generally by the numeral 26, is asymmetrically disposed about the rectifying junction 16. This asymmetrical disposition of the space charge about the rectifying junction is a result of the relatively heavier doping of the P region 14, as opposed to the extent of doping in N portion 12, and is employed in order to obtain a suitably large surface area on one face of the semiconductor body 10 entirely within the space-charge region. That is to say, N portion 12 is lightly doped, and, as a result, space-charge region 26 extends well into portion 12, such penetration being inversely proportional to the degree of doping of portion 12. Thus, in the face 28 of semiconductor body 10, the portion of the space-charge region extending into body portion 12 from the rectifying junction 16 is made desirably large by a light doping of such N portion. Further, the face 28 of semiconductor body 10 is preferably beveled as shown in the drawings, so as to further increase the extent of the surface area of face 28 within the space-charge region 26.

With a sufficiently large area of face 28 in the space-charge region 26 thus available, a semiconductive contact member 30 is placed thereon entirely within the space-charge region 26. Contact 30 is suitably doped so as to exhibit P-type conductivity, and contact 30 and N-type body portion 12 form a P-N rectifying junction on face 28. An ohmic contact 32 is provided on the upper face of P contact 30. A second semiconductive contact 34 is placed on the upper face of contact member 30, with contact member 34 being suitably doped so as to exhibit N-type conductivity. An ohmic contact 36 is provided on the upper face of contact member 34, and, as will be described in connection with FIG. 2, a suitable source of bias potential is applied between ohmic contacts 32 and 36 to bias the P-N junction formed between contact members 30 and 34.

FIG. 2 shows the semiconductor device 10 of FIG. 1 in side elevation, along with exemplary and preferred circuitry for establishing the desired potentials for the various elements of the device. Thus, the space-charge region 26 in semiconductor device 10 is produced by means of a voltage source 38, the negative terminal of which is connected to ohmic contact 20, and the positive terminal of which is connected to ohmic contact 18 through a suitable load indicated at 40 in FIG. 2. By means of this reverse bias the space-charge region 26 is established, and the width of region 26 depends upon the impurity concentration in the vicinity of the rectifying junction 16, the dielectric constant of the material, the applied voltage and the geometry of the structure. Since N region 12 of semiconductor device 10 is lightly doped, the space-charge region 26 extends well into such N portion from rectifying junction 16. With this selective doping, and with the beveled geometry of face 28, the application of a suitable reverse bias to rectifying junction 16 by means of potential source 38 results in a suitably large surface area on face 28 which is entirely within the space-charge region 26, so that contact member 30 may be mounted on face 28 entirely within the space-charge region.

In a manner similar to that of prior space-charge injection devices, a potential source 42 is provided to establish a suitable bias between P portion 14 of semiconductor body 10 and P contact member 30. In this connection, the negative terminal of source 42 is connected to ohmic contact 20 on P portion 14, and the positive terminal of source 42 is connected to ohmic contact 32 on P-type contact member 30.

As thus far described in connection with FIG. 2, the device and circuitry are somewhat analogous to the space-charge injection devices of the past. In these prior space-charge injection devices, and considering particularly the structure described thus far in connection with FIG. 2, an injection of holes would be effected from contact member 30 into the space-charge region 26 of semiconductor device 10. Such operation is feasible in some respects, but it has been found that the degree of injection is rather limited for some applications, and, as described above, it is believed that the limitation placed upon hole injection from a P contact member into a space-charge region is a result of space-charge limiting, in a manner analogous to that of the electron tube art.

In sharp contrast to such prior art devices, the device of the present invention employs a structure which produces injection of electrons, rather than holes, from the P contact member into the space-charge region. This desirable result is achieved by means of the utilization of a contact member 34 of N-type conductivity, placed on the upper surface of P contact member 30. A suitable source 44 of bias potenital is connected between ohmic contact 36 on N contact member 34 and ohmic contact 32 on P contact member 30. Since the negative terminal of source 44 is connected to ohmic contact 36, with the positive terminal of source 44 being connected to ohmic contact 32, the bias applied across the junction formed between contact members 30 and 34 is a forward bias, not a reverse bias, and, as a result, a large number of electrons diffuse into contact member 30 from contact member 34. These electrons are, in turn, made available for injection into the space-charge region 26 of semiconductor device 10.

In the operation of the device of FIGS. 1 and 2, and the associated circuitry shown in FIG. 2, the potential source 38 is applied between ohmic contact members 20 and 18 (the connection to the latter being through load 40) in such polarity as to create a reverse bias across rectifying junction 16. The application of this reverse bias between N portion 12 and P portion 14 of semiconductor device 10 establishes the space-charge region 26 of high field intensity in the vicinity of rectifying junction 16. As previously explained, the space-charge region 26 extends to a selected degree into N portion 12.

With the forward bias established across the P-N junction between contact members 30 and 34 by potential source 44, a large number of electrons flow from contact member 34 into contact member 30. Some of these electrons merely circulate through the series circuit composed of contact members 34 and 30, ohmic contact 32, potential source 44 and ohmic contact 36. However, most of the electrons diffuse across the junction between contact member 30 and face 28 of semiconductor device 10, and enter into the space-charge region 26. This action is a result of the potential applied to contact member 30 by means of source 42. The level of the potential applied by this source is selected so as to raise the potential of contact member 30 to the extent that approximately half (in an exemplary case) of contact member 30 is under forward bias and half under reverse bias. Since the electrons to be injected into space-charge region 26 from contact member 30 can enter the space-charge region only through that portion of contact member 30 which is under reverse bias, the portion of contact member 30 which is under forward bias presenting a barrier to electron flow, the desired level of injection may be determined by a selection of the voltage of source 42.

By means of the structure and circuitry shown, a copious injection of electrons from contact member 30 into the space-charge region 26 of semiconductor device 10 is achieved, such injection not being space-charge limited, but, to use the terminology of the electron tube art, temperature limited.

Figure 3:
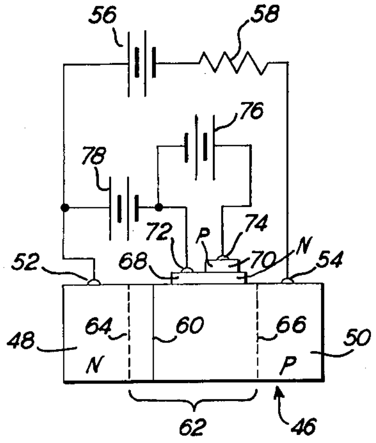
FIG. 3 is a schematic representation of a modified form of the device of the present invention, showing exemplary circuitry for establishing desired bias potentials.

FIG. 3 shows an alternate form of the device of the present invention, with several modifications having been made in comparison to the device described in connection with FIGS. 1 and 2. In FIG. 3, the semiconductor device is indicated generally at 46, comprising a region 48 of N-type conductivity and a region 50 of P-type conductivity. An ohmic contact 52 is supplied for N region 48, and a similar ohmic contact 54 is applied to region 50. A potential source 56 has its positive terminal connected to ohmic contact 52, and the negative terminal is connected to ohmic contact 54 through a suitable load 58. By means of the indicated polarity of potential source 56, a reverse bias is applied to the P-N rectifying junction existing between portions 48 and 50 of semiconductor device 46, such junction being indicated by the solid line 60. Further, as a result of this application of a reverse bias to the rectifying junction 60, a space-charge region indicated generally at 62 (and defined by dotted lines 64 and 66) is produced in the vicinity of rectifying junction 60. As discussed in connection with the space-charge region produced in the device of FIGS. 1 and 2, but in an opposite sense here in FIG. 3, a light doping of P portion 50 of semiconductor device 46 results in a desirably large penetration of portion 50 by the space charge. As may be seen, the device of FIG. 3 does not have the beveled geometry of the device of FIGS. 1 and 2, and this non-beveled geometry is acceptable where a sufficiently large surface area on the semiconductor device 46 entirely within the space charge 62 is obtained for the placement of the contact member 68 by sufficiently light doping of portion 50.

Contact member 68 is doped with an impurity in a manner which produces N-type conductivity therein. Thus, a rectifying junction is produced between contact member 68 and the associated face of semiconductor device 46 within the space charge 62. A second semiconductive contact member 70 is applied to the upper face of contact member 68, the contact member 70 being doped to provide P-type conductivity. Ohmic contacts 72 and 74 are applied to the respective semiconductive contacts 68 and 70, and a suitable source 76 of bias voltage is connected between these ohmic contacts. As may be seen, the negative terminal of source 76 is connected to ohmic contact 72, while the positive terminal of source 76 is connected to ohmic contact 74; thus, the bias applied across the rectifying junction between contact members 68 and 70 is a forward bias, not a reverse bias. By means of this forward bias, a large number of holes diffuse into contact member 68 from contact member 70. Some of this hole current follows the series circuit comprised of contact members 70 and 68, ohmic contact 72, source 76 and ohmic contact 74. However, a majority of the hole carriers are diffused into the space-charge region 62 of semiconductor device 46, as the result of the bias applied between contact member 52 and contact member 72 by means of potential source 78.

As shown, the positive terminal of source 78 is connected to ohmic contact 52 on the N portion 48 of the body 46, while the negative terminal of source 78 is connected to ohmic contact 72 on N semiconductive member 68. By a proper selection of the amplitude of the potential of source 78, approximately half (in an exemplary case) of contact member 68 is under reverse bias with respect to the contiguous face of body 46, while the other half of contact member 68 is under forward bias with respect to such face. Hole injection from contact member 68 into the space-charge region 62 of semiconductive device 46 takes place only through that portion of contact member 68 which is under reverse bias, the other portion (which is under forward bias) presenting a barrier to hole flow. Thus, by a proper selection of the potential of source 78, the desired level of hole injection into space-charge region 62 may be determined.

In the operation of the device of FIG. 3, the reverse bias applied across rectifying junction 60 of the main semi-conductor device 46 means of the potential source 56 establishes the space-charge region 62 in the vicinity of the rectifying junction 60. As previously explained, the portion 50 of body 46 is P-doped to a small degree. As the result of this selective doping, the space-charge region 62 is asymmetrically disposed about the rectifying junction 60, extending into the P region 50 to a much greater extent than into the N region 48. The extent to which space-charge region 62 extends into portion 50 from junction 60 may be established by a suitable level of doping in portion 50. The forward bias applied to the P–N junction between contact members 68 and 70 by means of potential source 76 causes a large flow of holes from contact member 70 into contact member 68. To an extent determined by the bias level applied to contact member 68 by potential source 78 (with respect to the underlying face of semiconductor device 46 in the space-charge region 62) a portion of the hole current which would normally flow from source 76 through contact members 70 and 68 back to source 76 is diverted into an injection of holes into the space-charge region 62 of body 46. By a suitable selection of the voltage of source 78, a copious flow may be achieved in the injection of holes into space charge 62.

In summary, it is believed that the injection of holes from a P-doped contact (and electrons from an N-doped contact) is space-charge limited; a barrier to the carrier flow exists between the contact and the contiguous edge of the space-charge region. On the other hand, the injection of electrons from a P-doped contact which is reverse biased for hole flow (and holes from an N-doped contact which is reverse biased for electron flow) is temperature limited; no barrier to the flow exists. Space-charge limited injection restricts the injected current to low values even at relatively large voltages, while temperature limited injection can yield large injection currents.

The invention has been described above in some detail, and particularly with reference to its application to semi-conductor diodes having a P–N junction. However, it will be apparent to those skilled in the art that the invention is also applicable to semiconductor junctions other than those between regions of P and N conductivities.

In addition, it will be appreciated by those skilled in the art that the asymmetrical disposition of the space charge about the main rectifying junction is not an essential condition in the present invention. That is to say, both the N and P body portions might be lightly doped, with the space charge then extending into both portions to a great degree. What is important is that at least one of the body portions be lightly doped in order to provide a desirably large surface area within the space charge on one or the other side of the rectifying junction between such body portions. In this connection, it will further be understood that where this selective doping is employed in connection with a semiconductor body having a beveled face (such as in FIGS. 1 and 2), the enlargement of the desired surface area in the space-charge region is enhanced by virtue of the fact that the borders of the space-charge region are not everywhere parallel. As shown in FIGS. 1 and 2, the geometrical asymmetry of the beveled face causes the border 22 to bend upwardly, as at 23, further increasing the portion of face 28 within space charge 26. In order to achieve this desirable additional enlargement of this surface, it is important that the angle $\theta$ (FIG. 2) between the junction 16 and beveled face 28 within the lightly-doped region 12 be smaller than ninety degrees.

Further, while the invention has been described in connection with an injecting contact of both the diffused and alloyed types, the inventive concept of this invention may also be applied to an injection contact of the point contact type, replacing, for example, contact member 34. Also, while the first semiconductive contact member and the contiguous region of the main body of the device (e.g., member 30 and portion 12, or member 68 and body portion 50) have been disclosed as being of opposite conductivity types, such is not a necessary condition, since once the space-charge region is established in a body, the initial conductivity type of such body is immaterial in this application.

Hence, the invention is not to be considered as limited to the particular details given, nor to the specific application to which reference has been made during the description of the apparatus, except insofar as may be required by the scope of the appended claims.

What is claimed is:

1. A semiconductor device comprising a body of semiconductive material having a first portion of one conductivity type and a second portion of a different conductivity type to form a rectifying junction between said portions, an ohmic contact member on said first body portion, an ohmic contact member on said second body portion, a third contact member of one conductivity type forming a rectifying junction with a surface of said semiconductor body within the space-charge region produced in said body upon the application of a reverse bias potential between said ohmic contact members, and a fourth contact member of conductivity type different from that of said third conduct member forming a rectifying junction with said third contact member.

2. A semiconductor device comprising a body of semiconductive material having a first portion of one conductivity type and a second portion of a different conductivity type to form a rectifying junction between said portions, an ohmic contact member on said first body portion, an ohmic contact member on said second body portion, a third contact member of one conductivity type forming a rectifying junction with a surface of said semiconductor body within the space-charge region produced in said body upon the application of a reverse bias potential between said ohmic contact members, and a fourth contact member of conductivity type opposite to that of said third contact member forming a rectifying junction with said third contact member.

3. A semiconductor device comprising a body of semiconductive material having a first portion of one conductivity type and a second portion of the opposite conductivity type to form a rectifying junction between said portions, an ohmic contact member on said first body portion, an ohmic contact member on said second body portion, a third contact member of one conductivity type forming a rectifying junction with a surface of said semiconductor body within the space-charge region produced in said body upon the application of a reverse bias potential between said ohmic contact members, and a fourth contact member of conductivity type opposite to that of said third contact member forming a rectifying junction with said third contact member.

4. A semiconductor device comprising a body of semiconductive material having a first portion of one conductivity type and a second portion of the opposite conductivity type to form a rectifying junction between said portions, an ohmic contact member on said first body portion, an ohmic contact member on said second body portion, a third contact member of one conductivity type forming a rectifying junction with a surface of said semiconductor body within the space-charge region produced in said body upon the application of a reverse bias potential between said ohmic contact members, and a fourth contact member of conductivity type different from that of said third contact member forming a rectifying junction with said third contact member.

5. A semiconductor device comprising a body of semiconductive material having a first portion of one conductivity type and a second portion of a second conductivity type to form a rectifying junction between said portions, an ohmic contact member on said first body portion, an ohmic contact member on said second body portion, a third contact member of P-type conductivity forming a rectifying junction with a surface of said semiconductor body within the space-charge region produced in said body upon the application of a reverse bias potential between said ohmic contact members, and a fourth contact member of N-type conductivity forming a rectifying junction with said third contact member.

6. A semiconductor device comprising a body of semiconductive material having a first portion of one conductivity type and a second portion of a second conductivity type to form a rectifying junction between said portions, an ohmic contact member on said first body portion, an ohmic contact member on said second body portion, a third contact member of N-type conductivity forming a rectifying junction with a surface of said semiconductive body within the space-charge region produced in said body upon the application of a reverse bias potential between said ohmic contact members, and a fourth contact member of P-type conductivity forming a rectifying junction with said third contact member.

7. A semiconductor device comprising a body of semiconductive material having a first portion of P-type conductivity and a second portion of N-type conductivity to form a P-N rectifying junction between said portions, an ohmic contact member on said first body portion, an ohmic contact member on said second body portion, a third contact member of P-type conductivity forming a rectifying junction with a surface of said semiconductive body within the space-charge region produced in said body upon the application of a reverse bias potential between said ohmic contact members, and a fourth contact member of N-type conductivity forming a rectifying junction with said third contact member.

8. A semiconductor device comprising a body of semiconductive material having a first portion of P-type conductivity and a second portion of N-type conductivity to form a P-N rectifying junction between said portions, an ohmic contact member on said first body portion, an ohmic contact member on said second body portion, a third contact member of N-type conductivity forming a rectifying junction with a surface of said semiconductive body within the space-charge region produced in said body upon the application of a reverse bias potential between said ohmic contact members, and a fourth contact member of P-type conductivity forming a rectifying junction with said third contact member.

9. A semiconductor device comprising a body of semiconductive material having a first portion of one conductivity type and a second portion of a second conductivity type to form a rectifying junction between said portions, an ohmic contact member on said first body portion, an ohmic contact member on said second body portion, one of said body portions being impurity-doped to a selected degree to produce a space-charge region of corresponding extent in said one region from said junction between said body portions upon the application of an electrical potential between said ohmic contacts, a third contact member of one conductivity type forming a rectifying junction with a surface of said semiconductive body within said space-charge region, and a fourth contact member of conductivity type different from that of said third contact member forming a rectifying junction with said third contact member.

10. A semiconductor device comprising a body of semiconductive material having a first portion of P-type conductivity and a second portion of N-type conductivity to form a rectifying junction between said portions, an ohmic contact member on said first body portion, an ohmic contact member on said second body portion, said second body portion being impurity-doped to a significantly smaller degree to produce a space-charge region of corresponding extent in said second body portion from said rectifying junction between said body portions upon the application of a reverse bias potential between said ohmic contact members, a third contact member of P-type conductivity forming a rectifying junction with a surface of said second body portion within said space-charge region, and a fourth contact member of N-type conductivity forming a rectifying junction with said third contact member.

11. A semiconductor device comprising a body of semiconductive material having a first portion of N-type conductivity and a second portion of P-type conductivity to form a rectifying junction between said portions, an ohmic contact member on said first body portion, an ohmic contact member on said second body portion, said second body portion being impurity-doped to a significantly smaller degree to produce a space-charge region of corresponding extent in said second body portion from the rectifying junction between said body portions upon the application of a reverse bias potential between said ohmic contact members, a third contact member of N-type conductivity forming a rectifying junction with a surface of said second body portion within said space-charge region, and a fourth contact member of P-type conductivity forming a rectifying junction with said third contact member.

12. A semiconductor space-charge injection circuit comprising a body of semiconductive material having a first portion of one conductivity type and a second portion of a second conductivity type to form a rectifying junction between said portions, an ohmic contact member on said first body portion, an ohmic contact member on said second body portion, a third contact member of one conductivity type forming a rectifying junction with a surface of said semiconductive body within the space-charge region produced in said body upon the application of a reverse bias potential between said ohmic contact members, a fourth contact member of conductivity type different from that of said third contact member and forming a rectifying junction with said third contact member, a source of potential connected between said ohmic contact members in such polarity as to reverse-bias said rectifying junction between said first and second body portions, an ohmic contact member on said third contact member, an ohmic contact member on said fourth contact member, a source of electrical potential connected between said ohmic contacts on said third and fourth contact members in such polarity as to bias the rectifying junction between said third and fourth contact members in the forward direction, and a source of electrical potential connected between the ohmic contact member on said third contact member and one of said ohmic contact members on said first and second body portions in such voltage and polarity as to bias said third contact member forwardly in part and reverse in part with respect to the contiguous surface of said semiconductive body.

13. A semiconductive space-charge injection circuit comprising a body of semiconductive material having a first portion of P-type conductivity and a second portion of N-type conductivity to form a P-N rectifying junction between said portions, an ohmic contact member on said first body portion, an ohmic contact member on said second body portion, a third contact member of P-type conductivity forming a rectifying junction with a surface of said semiconductor body within the space-charge region produced in said body upon the application of a reverse bias potential between said ohmic contact members, a fourth contact member of N-type conductivity forming a rectifying junction with said third contact member, a source of electrical potential connected between said ohmic contact members with the negative terminal thereof connected to the ohmic contact member on said first portion and the positive terminal connected through a load to the ohmic contact member on said second portion, an ohmic contact member on said third contact member, an ohmic contact member on said fourth contact member, a source of electrical potential the negative terminal of which is connected to the ohmic contact on said fourth contact member and the positive terminal of which is connected to the ohmic contact on said third contact member, and a source of electrical potential the positive terminal of which is connected to the ohmic contact on said third contact member and the negative terminal of which is connected to the ohmic contact on said first body portion.

14. A semiconductive space-charge injection circuit comprising a body of semiconductive material having a first portion of N-type conductivity and a second portion of P-type conductivity to form a P-N rectifying junction between said portions, an ohmic contact member on said first body portion, an ohmic contact member on said second body portion, a third contact of N-type conductivity forming a rectifying junction with a surface of said semiconductive body within the space-charge region produced in said body upon the application of a reverse bias potential between said ohmic contact members, a fourth contact member of P-type conductivity forming a rectifying junction with said third contact member, a source of electrical potential the positive terminal of which is connected to the ohmic contact on said first body portion and the negative terminal of which is connected through a load to the ohmic contact member on said second body portion, an ohmic contact on said third contact member, an ohmic contact on said fourth contact member, a source of electrical potential the negative terminal of which is connected to the ohmic contact member on said third contact member and the positive terminal of which is connected to the ohmic contact member on said fourth contact member, and a source of electrical potential the positive terminal of which is connected to the ohmic contact on said first body portion and the negative terminal of which is connected to the ohmic contact on said third contact member.

References Cited in the file of this patent

UNITED STATES PATENTS

| | | |
|---|---|---|
| 2,769,926 | Lesk | Nov. 6, 1956 |
| 2,778,956 | Dacey | Jan. 22, 1957 |
| 2,779,877 | Lehovec | Jan. 29, 1957 |
| 2,869,055 | Noyce | Jan. 13, 1959 |